United States Patent
Lee et al.

(10) Patent No.: US 8,730,418 B2
(45) Date of Patent: May 20, 2014

(54) ARRAY SUBSTRATE AND METHOD FOR MANUFACTURING THE SAME

(71) Applicant: Samsung Electronics Co., Ltd., Suwon-si (KR)

(72) Inventors: Seong-Young Lee, Anyang-si (KR); Sahng-Ik Jun, Yongin-si (KR); Kyung-Ho Park, Asan-si (KR); Yoon-Jang Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/705,896

(22) Filed: Dec. 5, 2012

(65) Prior Publication Data
US 2013/0095589 A1    Apr. 18, 2013

Related U.S. Application Data

(62) Division of application No. 12/172,615, filed on Jul. 14, 2008, now Pat. No. 8,350,975.

(30) Foreign Application Priority Data

Dec. 28, 2007    (KR) .................. 10-2007-0140441

(51) Int. Cl.
*G02F 1/1343* (2006.01)
*G02F 1/1333* (2006.01)

(52) U.S. Cl.
USPC .............................. 349/38; 349/29; 349/110

(58) Field of Classification Search
USPC ........................................ 349/38, 39, 29, 110
See application file for complete search history.

(56) References Cited

U.S. PATENT DOCUMENTS

| | | | |
|---|---|---|---|
| 5,847,781 A | 12/1998 | Ono et al. | |
| 6,822,703 B2 * | 11/2004 | Hwang et al. | 349/43 |
| 6,969,889 B2 | 11/2005 | Cho et al. | |
| 7,369,188 B2 * | 5/2008 | Lee et al. | 349/39 |
| 2006/0028591 A1 | 2/2006 | Kim | |

FOREIGN PATENT DOCUMENTS

KR    1020060111265 A    10/2006

* cited by examiner

*Primary Examiner* — Eric Wong
(74) *Attorney, Agent, or Firm* — Cantor Colburn LLP

(57) ABSTRACT

In an array substrate capable of improving the quality of displayed images and a method for manufacturing the array substrate, the array substrate includes a base substrate, a first conductive pattern including a gate line and a first light-blocking pattern, a semiconductor layer overlapping the light-blocking pattern, a second conductive pattern including a data line and a storage line overlapping the first light-blocking pattern, and a pixel electrode overlapping the storage line to form a storage capacitor. The first conductive pattern may further include a second light-blocking pattern overlapping the semiconductor layer which is formed under the data line. The first and second light-blocking patterns block light proceeding toward the semiconductor layer formed under the storage line and under the data line, respectively, so that the semiconductor layer may be prevented from being excited by light energy.

8 Claims, 13 Drawing Sheets

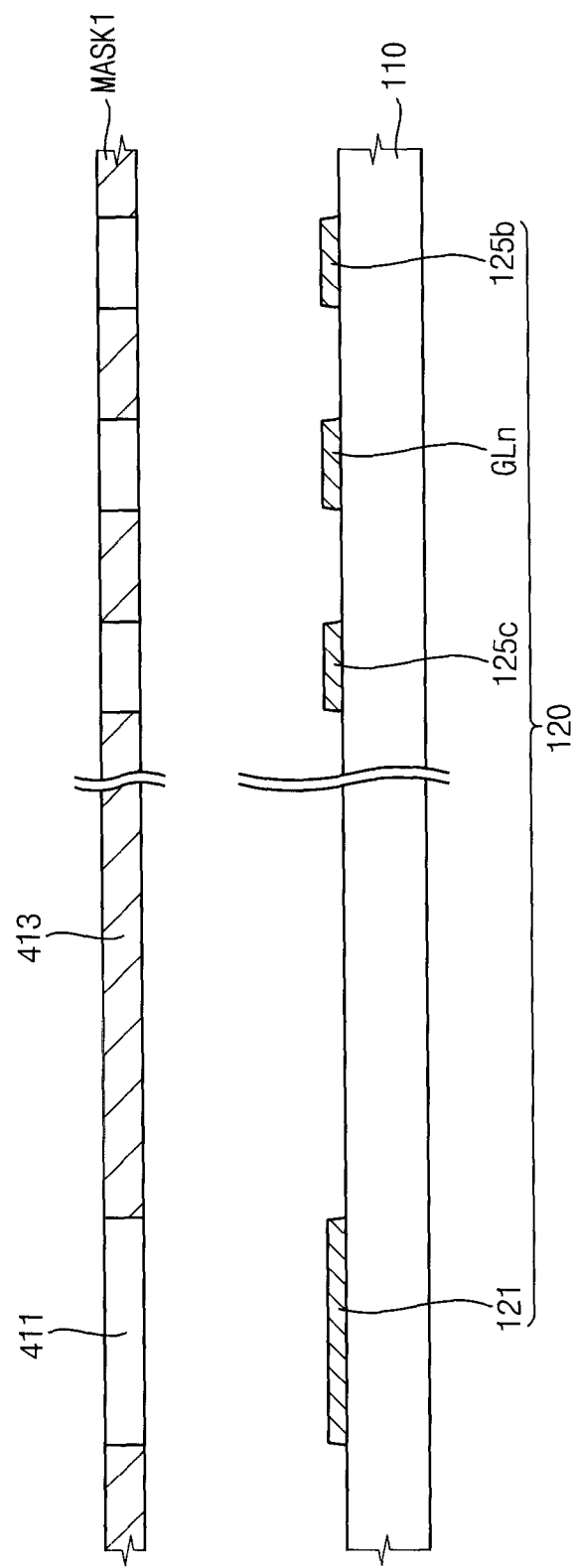

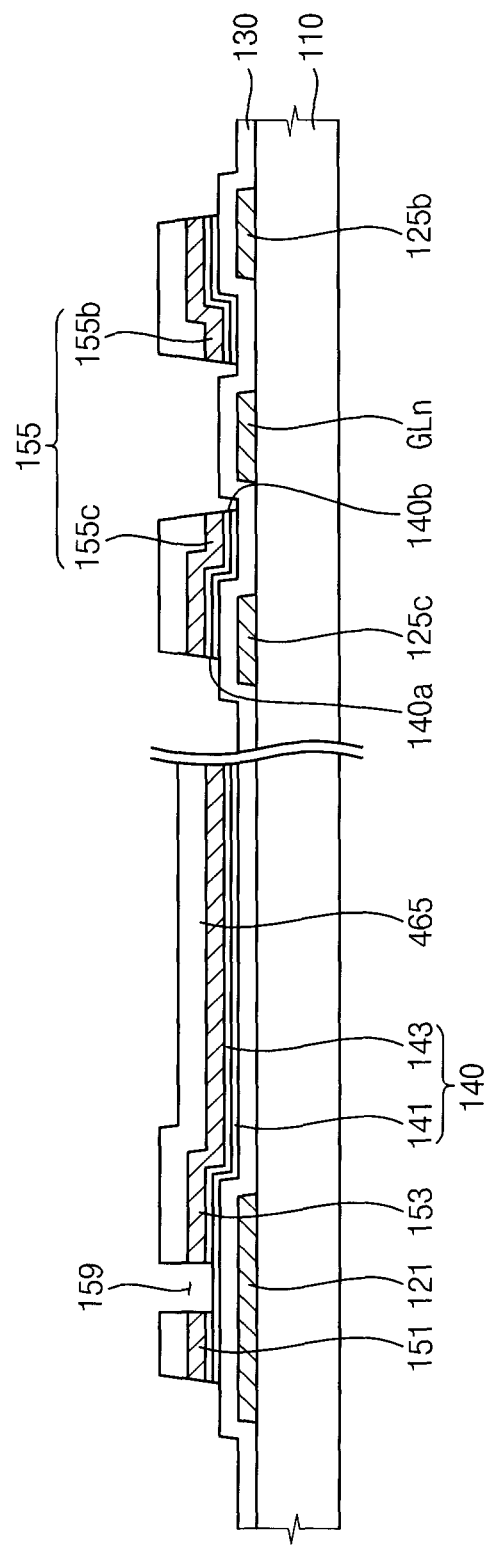

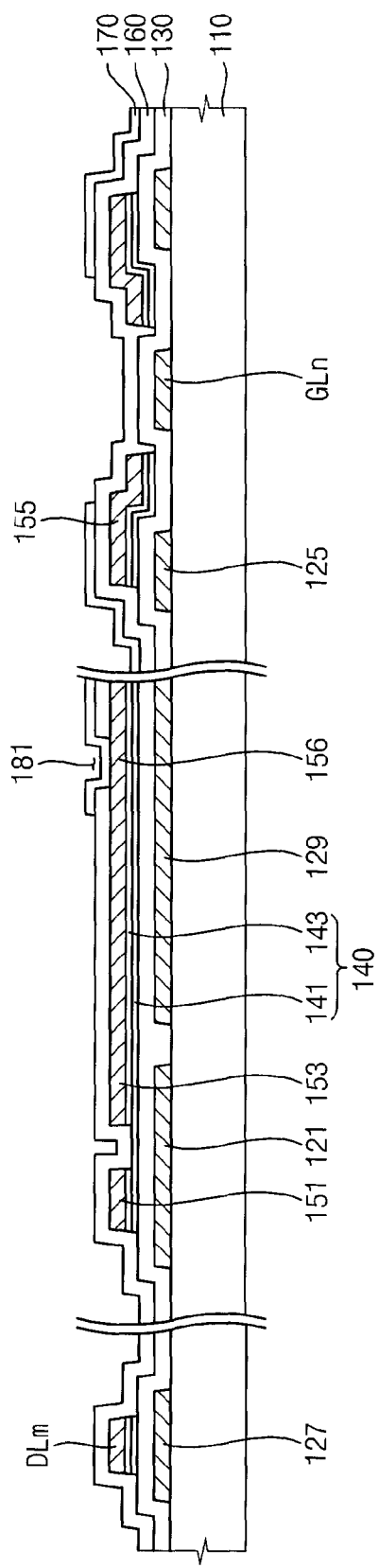

ARRAY SUBSTRATE AND METHOD FOR MANUFACTURING THE SAME

CROSS REFERENCE TO RELATED APPLICATIONS

The present application is a divisional of U.S. patent application Ser. No. 12/172,615, filed on Jul. 14, 2008, which claims priority to Korean Patent Application No. 2007-140441, filed on Dec. 28, 2007, and all the benefits accruing therefrom under 35 U.S.C. §119, the contents of which in their entirety are herein incorporated by reference.

BACKGROUND OF THE INVENTION

1. Field of the Invention

The present invention relates to an array substrate and a method for manufacturing the array substrate. More particularly, the present invention relates to an array substrate and a method for manufacturing the array substrate capable of improving quality of a displayed image.

2. Description of the Related Art

Generally, a liquid crystal display device includes a liquid crystal display panel displaying an image using the light transmittance of liquid crystal and a backlight assembly disposed under the liquid crystal display panel to provide the liquid crystal display panel with light.

The liquid crystal display panel includes an array substrate, a color filter substrate facing the array substrate and a liquid crystal layer interposed between the array substrate and the color filter substrate.

The array substrate includes a plurality of unit pixels. The array substrate includes gate lines, data lines, thin-film transistors ("TFTs") electrically connected to the gate and the data lines, pixel electrodes electrically connected to the TFTs, and storage lines forming a storage capacitor. The storage lines overlap the pixel electrodes to form the storage capacitor which maintains a pixel voltage applied to each of the pixel electrodes for one frame.

When the number of processes and the number of masks used in processes for forming the array substrate are reduced, costs are correspondingly reduced. To reduce the number of processes, an active layer may be simultaneously formed with the storage line. However, when light is applied to the active layer formed under the storage line to display an image, the active layer absorbs the light and thereby changes the capacitance of the storage capacitor formed by the storage line.

When the capacitance of the storage capacitor is changed, a kickback voltage becomes different from an expected level, and a deviation of the kickback voltage occurs in the pixels. The deviation of the kickback voltage may cause image flicker or a waterfall defect displaying stripes, thus deteriorating the quality of the image.

BRIEF SUMMARY OF THE INVENTION

An exemplary embodiment of the present invention provides an array substrate having a structure capable of preventing storage capacitance from being changed by light.

Another exemplary embodiment of the present invention provides a method for manufacturing the array substrate.

In accordance with an aspect of the present invention, there is provided an array substrate including a base substrate, a first conductive pattern disposed on the base substrate, a semiconductor layer disposed on the first conductive pattern, a second conductive pattern disposed on the semiconductor layer and a pixel electrode disposed on the second conductive pattern. The first conductive pattern includes a gate line and a first light-blocking pattern. The semiconductor layer overlaps the first light-blocking pattern. The second conductive pattern includes a data line extending in a second direction crossing a first direction defining an extension direction of the gate line and a storage line overlapping the first light-blocking pattern. The pixel electrode overlaps the storage line to form a storage capacitor.

In an exemplary embodiment, the semiconductor layer may be in contact with the storage line.

In some exemplary embodiments, a first end portion of the semiconductor layer may overlap the pixel electrode, and a second end portion of the semiconductor layer opposite to the first end portion may protrude from an edge of the pixel electrode in a plan view. Here, the first light-blocking pattern may overlap the first end portion of the semiconductor layer to block light proceeding toward the first end portion of the semiconductor layer.

In some exemplary embodiments, the storage line may include a main storage line extending in the second direction, a first sub storage line extending from the main storage line in the first direction substantially perpendicular to the second direction, and a second sub storage line extending from the main storage line in the first direction substantially perpendicular to the second. The first sub storage line may overlap a first end portion of the pixel electrode. The second sub storage line may overlap a second end portion of the pixel electrode opposite to the first end portion thereof.

The first light-blocking pattern may include a main light-blocking pattern extending in the second direction and overlapping the main storage line, a first sub light-blocking pattern extending from the main light-blocking pattern in the first direction and overlapping the first sub storage line, and a second sub light-blocking pattern extending from the main storage in the first direction and overlapping the second sub storage line. The main storage line and the main light-blocking pattern may extend across the center of the pixel electrode. Alternatively, each of the storage line and the first light-blocking pattern may be substantially symmetrical with respect to a virtual line passing through the center of the pixel electrode in the second direction.

In an exemplary embodiment, the first conductive pattern may further include a second light-blocking pattern overlapping the semiconductor layer formed under the data line.

In some exemplary embodiments, the array substrate may further include a thin-film transistor ("TFT") formed in each unit pixel, a first contact hole electrically connecting the pixel electrode to the TFTs disposed in odd-numbered rows, and a second contact hole electrically connecting the pixel electrode to the TFTs disposed in even-numbered rows.

In some exemplary embodiments, the second conductive pattern may further include a first connection electrode disposed corresponding to the first contact hole and a second connection electrode disposed corresponding to the second contact hole. A sum of a first overlapping area between the first connection electrode and the pixel electrode and a second overlapping area between the second connection electrode and the pixel electrode is constant in each of the unit pixels. The first conductive pattern may further include a third light-blocking pattern that overlaps the first connection electrode and the second connection electrode.

In accordance with another aspect of the present invention, there is provided a method for manufacturing an array substrate. According to the method, a first conductive layer is formed on a base substrate, and the first conductive layer is patterned to form a first conductive pattern including a gate line and a first light-blocking pattern. A semiconductor layer and a second conductive layer are formed on the first conductive pattern. The second conductive layer and the semiconductor layer are patterned to form a second conductive pattern and a pattern of the semiconductor layer overlapping the first light-blocking pattern. The second conductive pattern includes a data line extending in a second direction crossing a first direction defining an extension direction of the gate line and a storage line overlapping the first light-blocking pattern. A pixel electrode is formed on the second conductive layer. The pixel electrode overlaps the storage line.

In an exemplary embodiment, the semiconductor layer may be in contact with the storage line In an exemplary embodiment, the semiconductor layer may be patterned so that a first end portion of the semiconductor layer overlaps the first light-blocking pattern and a second end portion of the semiconductor layer opposite to the first end portion protrudes from an edge of the first light-blocking pattern in a plan view.

In some exemplary embodiments, the storage line may include a main storage line extending in the second direction, a first sub storage line extending from the main storage line in the first direction substantially perpendicular to the second direction, and a second sub storage line extending from the main storage line in the first direction substantially perpendicular to the second direction. The first sub storage line may overlap a first end portion of the pixel electrode.

In some exemplary embodiments, the second sub storage line may overlap a second end portion of the pixel electrode opposite to the first end portion thereof. The first light-blocking pattern may include a main light-blocking pattern extending in the second direction and overlapping the main storage line, a first sub light-blocking pattern extending from the main light-blocking pattern in the first direction and overlapping the first sub storage line, and a second sub light-blocking pattern extending from the main light-blocking pattern in the first direction and overlapping the second sub storage line.

In one exemplary embodiment, the first conductive pattern may further include a second light-blocking pattern overlapping the data line.

In some exemplary embodiments, the second conductive layer may be patterned to form a source electrode and a drain electrode spaced apart from the source electrode. The second conductive layer may be patterned to form the source electrode and the drain electrode as follows. A photoresist layer is formed on the second conductive layer, and the photoresist layer is patterned using a slit mask having a slit or a half-tone mask having a translucent portion to form a photoresist pattern having a recessed portion situated corresponding to the slit or the translucent portion. A portion of the photoresist pattern corresponding to where the recessed portion is situated is removed to expose a portion of the second conductive layer corresponding to where the recessed portion is situated, and the exposed portion of the second conductive layer is etched to form the source electrode and the drain electrode.

According to the present invention, a first light-blocking pattern formed under a storage line blocks light proceeding toward a semiconductor layer, so that the semiconductor layer under the storage line may be prevented from being excited by light energy. Accordingly, a storage capacitance may be prevented from being changed and a deviation of a kickback voltage may be prevented from occurring, so that the quality of displayed images may be improved.

Further, a second light-blocking pattern formed under a data line blocks light proceeding toward a semiconductor layer, so that the semiconductor layer formed under the data line may be prevented from being excited by light energy.

Accordingly, electrical characteristics such as a voltage level of a voltage applied to the data line may be prevented from being changed, so that the quality of displayed images may be improved.

BRIEF DESCRIPTION OF THE DRAWINGS

The above and other aspects, features and advantages of the present invention will become more apparent by describing in more detail exemplary embodiments thereof with reference to the accompanying drawings, in which:

FIGS. 4A to 4G are cross-sectional views illustrating a method of manufacturing an array substrate in accordance with an exemplary embodiment of the present invention;

FIG. 7 is a cross-sectional view illustrating a portion of the array substrate in accordance with yet another exemplary embodiment of the present invention.

DETAILED DESCRIPTION OF THE INVENTION

Figure 1:
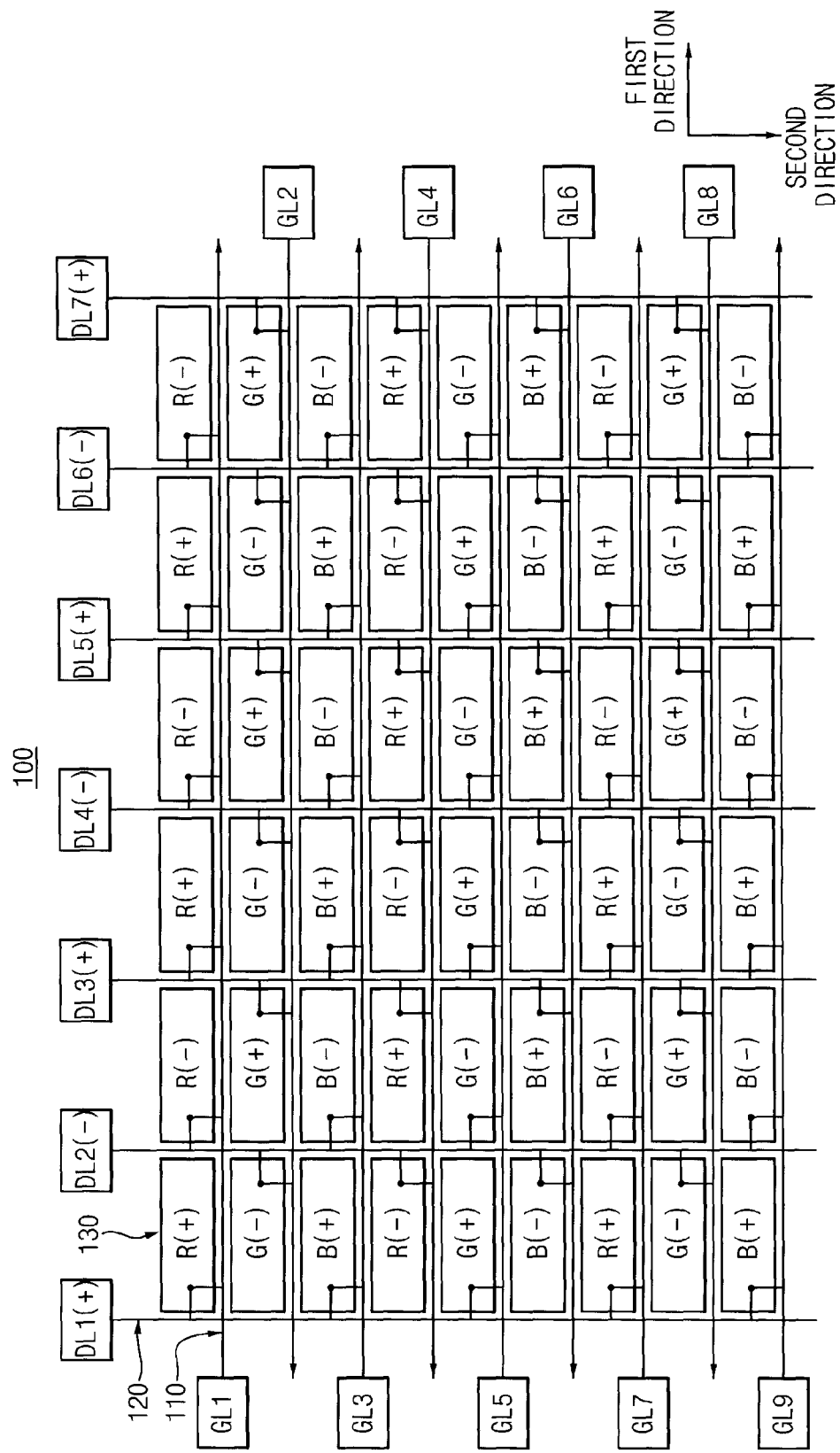
FIG. 1 is a plan view illustrating an array substrate in accordance with an exemplary embodiment of the present invention.

The present invention will now be described more fully hereinafter with reference to the accompanying drawings, in which exemplary embodiments of the present invention are shown. The present invention may, however, be embodied in many different forms and should not be construed as limited to the exemplary embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected to or coupled to the other element or layer, or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein are interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Furthermore, relative terms, such as "lower" or "bottom" and "upper" or "top" may be used herein to describe one element's relationship to other elements as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on the "upper" side of the other elements. The example term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The example terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of exemplary embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to the accompanying drawings.

FIG. 1 is a plan view illustrating an array substrate in accordance with an exemplary embodiment of the present invention.

Referring to FIG. 1, an array substrate 100 includes a gate line 110, a data line 120 and a pixel electrode 130.

Figure 2:
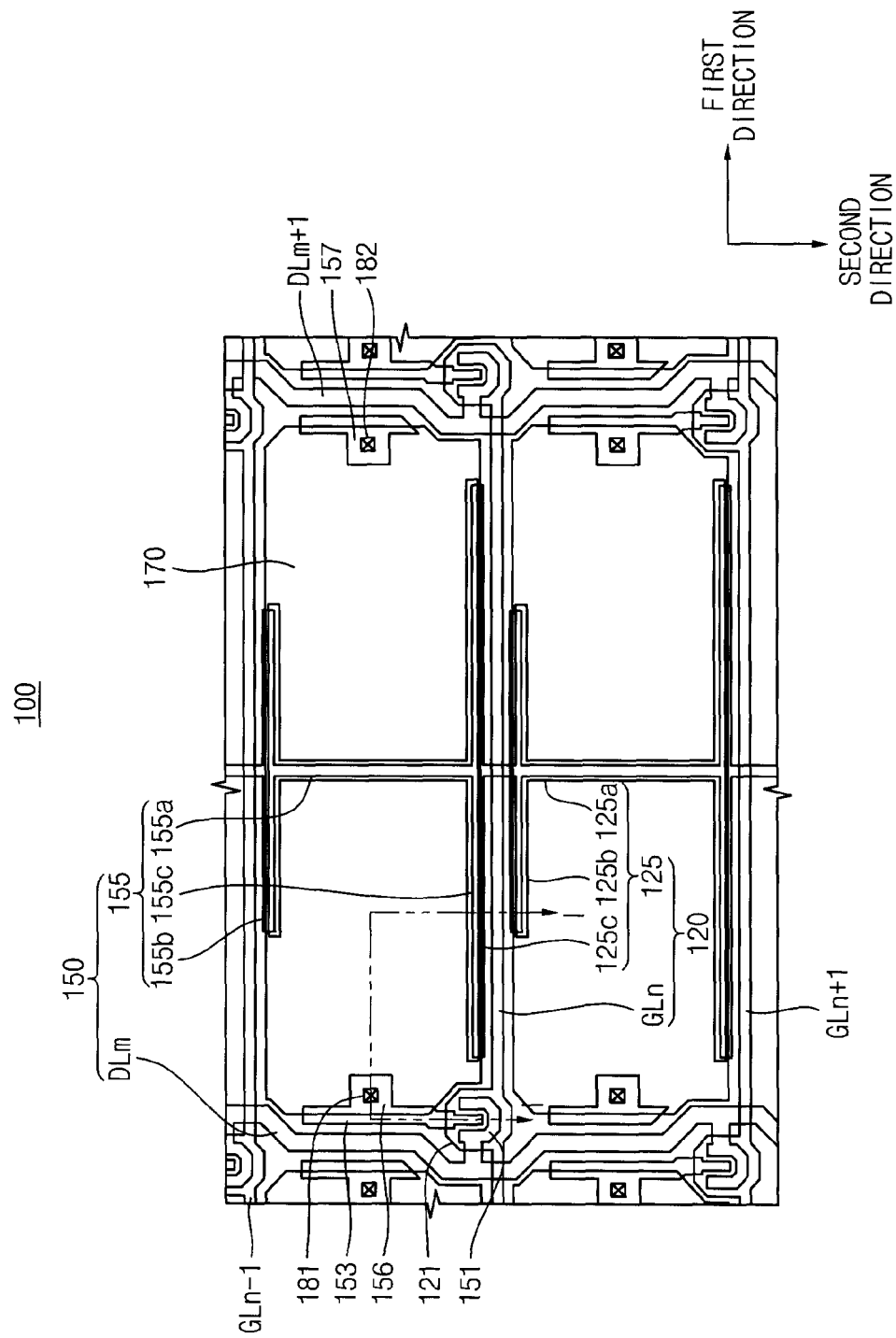
FIG. 2 is an enlarged plan view of a portion of the array substrate of FIG. 1 in accordance with an exemplary embodiment of the present invention.

A plurality of the gate lines 110 is formed in a first direction, and a plurality of the data lines 120 is formed in a second direction which is substantially perpendicular to the first direction, as illustrated in FIG. 2. For example, first to ninth gate lines GL1, GL2, . . . , GL9 are formed in the first direction, and first to seventh data lines DL1, DL2, . . . , DL7 are formed in the second direction. The gate lines GL1, GL2, . . . , GL9 are electrically connected to a gate driving part (not illustrated) to receive gate signals, and the data lines DL1, DL2, . . . , DL7 are electrically connected to a data driving part (not illustrated) to receive data signals.

In an exemplary embodiment, as illustrated in FIG. 1, the gate driving part includes a left gate driving part (not illustrated) and a right gate driving part (not illustrated). The left gate driving part is electrically connected to left terminals of odd-numbered gate lines GL1, GL3, GL5, GL7 and GL9, and the right gate driving part is electrically connected to right terminals of even-numbered gate lines GL2, GL4, GL6 and GL8. Alternatively, all left terminals or all right terminals of the gate lines GL1, GL2, . . . , GL9 may be electrically connected to a single gate driving part.

The array substrate 100 includes a plurality of unit pixels. The pixel electrode 130 is formed in each unit pixel, and thus the pixel electrodes 130 are arranged in a matrix.

Each unit pixel may have a rectangular shape whose side in the first direction is longer than that in the second direction. Accordingly, the pixel electrode 130 may have a rectangular shape.

The gate lines GL1, GL2, . . . , GL9, the data lines DL1, DL2, . . . , DL7 and the pixel electrodes 130 are electrically interconnected in the following manner.

Each of the gate lines GL1, GL2, . . . , GL9 is electrically connected to all of the pixel electrodes 130 in a corresponding column of pixels. The pixel electrodes 130 in odd-numbered rows are electrically connected to a corresponding data line DL1, DL2, . . . , DL7 which are disposed at left sides of the pixel electrodes 130 in the odd-numbered rows, and the pixel electrodes 130 in even-numbered rows are electrically connected to a corresponding data line DL1, DL2, . . . , DL7 which are disposed at right sides of the pixel electrodes 130 in the even-numbered rows.

In one exemplary embodiment, data signals for vertical inversion of the panel may be applied to each of the data lines DL1, DL2, . . . , DL7. For example, during one frame, a data signal having a positive voltage is applied to a selected data line, and a data signal having a negative voltage is applied to the data line adjacent to the selected data line. During the next frame, a data signal having a negative voltage is applied to the selected data line, and a data signal having a positive voltage is applied to the data line adjacent to the selected data line.

Figure 3:
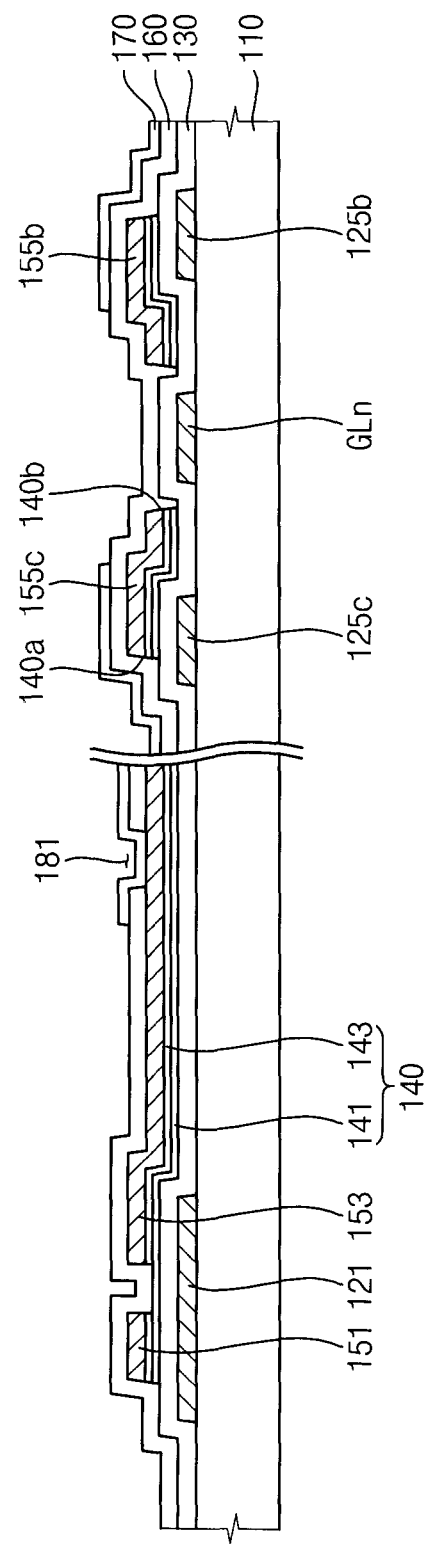
FIG. 3 is a cross-sectional view of the array substrate taken along line I-I' in FIG. 2.

FIG. 2 is an enlarged plan view of a portion of the array substrate of FIG. 1 in accordance with an exemplary embodiment of the present invention, and FIG. 3 is a cross-sectional view of the array substrate taken along line I-I' in FIG. 2.

Referring to FIGS. 2 and 3, the array substrate 100 includes a base substrate 110 including a plurality of pixel regions, a first conductive pattern 120 formed on the base substrate 110, a semiconductor layer 140 formed on the first conductive pattern 120, a second conductive pattern 150 formed on the semiconductor layer 140, and a pixel electrode 170 formed on the second conductive pattern 150.

The first conductive pattern 120 includes gate lines GLn−1, GLn and GLn+1, and a light-blocking pattern 125, as best seen in FIG. 2. Herein, 'n' represents a natural number larger than one. The gate lines GLn−1, GLn and GLn+1 are formed on the base substrate 110, and extend in the first direction. The light-blocking pattern 125 will be described in more detail below. The first conductive pattern 120 further includes a gate electrode 121 protruding from the gate lines GLn−1, GLn and GLn+1. The gate electrode 121 is a control electrode through which a control signal controlling a switching element is applied to the switching element.

A gate insulation layer 130 is formed on the first conductive pattern 120 to cover the first conductive pattern 120. For example, the gate insulation layer 130 may comprise silicon nitride ("SiNx") or silicon oxide ("SiOx").

A semiconductor layer 140 including an active layer 141 and an ohmic contact layer 143 is formed on the gate insulation layer 130. For example, the active layer 141 may comprise amorphous silicon, and the ohmic contact layer 143 may comprise amorphous silicon doped with n+ ions. Herein, a portion of the semiconductor layer 140 formed on the gate electrode 121 is generally referred to as a channel layer for forming a channel of a thin-film transistor ("TFT"). The semiconductor layer 140 overlaps the light-blocking pattern 125 of the first conductive pattern 120. Accordingly, the light-blocking pattern 125 may block light directed toward the semiconductor layer 140, when the light is provided to the array substrate 100 from underneath the array substrate 100. As described above, it is noted that the light-blocking pattern 125 is included to the first conductive pattern 120 which is a conductive pattern including the gate lines GLn−1, GLn and GLn+1.

The second conductive pattern 150 includes data lines DLm and DLm+1 extending in a direction crossing an extension direction (e.g., the first direction) of the gate lines GLn−1, GLn and GLn+1, and a storage line 155 overlapping the light-blocking pattern 125. Herein, 'm' represents a natural number. The data lines DLm and DLm+1 are formed on the base substrate 110, and extend in the second direction. The storage line 155 is formed on the semiconductor layer 140. Similar to the semiconductor layer 140, the storage line 155 overlaps the light-blocking pattern 125 of the first conductive pattern 120.

The second conductive pattern 150 further includes a source electrode 151 extending from the data lines DLm and DLm+1, and a drain electrode 153 separated from the source electrode 151. The source electrode 151 is an input electrode through which a data signal is applied to a switching element, and the drain electrode 153 is an output electrode through which a signal corresponding to the data signal is outputted. The gate electrode 121, the source electrode 151 and the drain electrode 153 constitute a TFT, which is a type of switching element.

A passivation layer 160 may be formed on the second conductive pattern 150 to cover the source electrode 151, the drain electrode 153 and the storage line 155.

The pixel electrode 170 is formed in each unit pixel. A pixel voltage is applied to the pixel electrode 170. The pixel electrode 170 may be formed on the passivation layer 160. The pixel electrode 170 and a common electrode (not illustrated) formed on an opposite substrate (not illustrated) facing the array substrate 100 generate an electric field between the two substrates to rearrange liquid crystal molecules.

The pixel electrode 170 is electrically connected to the TFT through contact holes 181 and 182 that are formed at the passivation layer 160. For example, the pixel electrode 170 is electrically connected to a first connection electrode 156 extending from the drain electrode 153 through a first contact hole 181. Accordingly, the pixel electrode 170 is electrically connected to the drain electrode 153 of the TFT. Similarly, the pixel electrode 170 is electrically connected to a second connection electrode 157 extending from the drain electrode 153 through a second contact hole 182.

In an exemplary embodiment, the TFTs disposed in odd-numbered rows may be electrically connected to the pixel electrode 170 through the first contact hole 181, and the TFTs disposed in even-numbered rows may be electrically connected to the pixel electrode 170 through the second contact hole 182. For example, the first connection electrode 156 and the first contact hole 181 may be separated from and disposed to a right of a left data line DLm, and the second connection electrode 157 and the second contact hole 182 may be separated from and disposed to the left of a right data line DLm+1. That is, the first connection electrode 156 and the second connection electrode 157 may be formed at a leftmost portion and a rightmost portion, respectively, of the unit pixel.

In an exemplary embodiment, the first and second connection electrodes 156 and 157 may be substantially symmetrical with respect to a virtual line passing through the center of each unit pixel in the second direction. When the first and second connection electrodes 156 and 157 are symmetrically disposed in the unit pixel, an overlapping area between the pixel electrode 170 and the first and second connection electrodes 156 and 157 may be constant even though a misalignment between the pixel electrode 170 and the first and second connection electrodes 156 and 157 occurs. When the overlapping area between the pixel electrode 170 and the first and second connection electrodes 156 and 157 is constant, changes of electrical characteristics caused by the misalignment, such as a change of a reference voltage, a change of a pixel voltage, etc., may be reduced. For example, even though the pixel electrode 170 is disposed closer to the left data line DLm than the right data line DLm+1, that is, a misalignment occurs, the sum of the overlapping area between the pixel electrode 170 and the first connection electrodes 156 and the overlapping area between the pixel electrode 170 and the second connection electrodes 157 is constant, and thus the change of electrical characteristics caused by the misalignment may be prevented.

Alternatively, the first and second connection electrodes 156 and 157 which are not electrically connected to the TFT may be omitted.

According to exemplary embodiments of the present invention, the pixel electrode 170 overlaps the storage line 155 to form a storage capacitor. The storage capacitor maintains a pixel voltage applied to the pixel electrode 170 for one frame. In a process for reducing the number of masks in accordance with one exemplary embodiment of the present invention (for example, a process using four masks described with reference to FIGS. 4A to 4G), the semiconductor layer 140 and the storage line 155 are patterned by the same mask, and thus a portion of the semiconductor layer 140 is usually formed under the storage line 155.

When light provided from underneath the array substrate 100 to display an image enters into the semiconductor layer 140, the semiconductor layer 140 is excited by light energy, and thus the electrical characteristics of the storage line 155 formed on the semiconductor layer 140 may be affected by the excited semiconductor layer 140. For example, the capacitance of the storage capacitor formed by the storage line 155 may be affected by the excited semiconductor layer 140. That is, the capacitance of the storage capacitor when the light is provided from the underneath the array substrate 100 is larger than that when the light is not provided. When the capacitance of the storage capacitor is larger than an expected value, a kickback voltage may be considerably reduced from an expected level, and thus a deviation of the kickback voltage occurs. The deviation of the kickback voltage causes defects such as an imbalance of brightness, image flicker, a waterfall defect displaying stripes, etc.

According to the present invention, to block the light proceeding toward the semiconductor layer 140 formed under the storage line 155, the light-blocking pattern 125 is formed under and overlapping the semiconductor layer 140. As described above, the light-blocking pattern 125 is formed with the same conductive layer as that which forms the gate lines GLn−1, GLn and GLn+1 and the gate electrode 121. That is, the first conductive pattern 120 includes the gate electrode 121, the light-blocking pattern 125 and the gate lines GLn−1, GLn and GLn+1.

In an exemplary embodiment, the storage line 155 may include a main storage line 155a, a first sub storage line 155b and a second sub storage line 155c. The main storage line 155a extends in the second direction. The first sub storage line 155b and the second sub storage line 155c extend from the main storage line 155a in the first direction. Here, it may be understood that the semiconductor layer 140 may be formed under the first sub storage line 155b and the second sub storage line 155c.

In order to block the light proceeding toward the semiconductor layers 140 formed under the main storage line 155a, the first sub storage line 155b and the second sub storage line 155c, the light-blocking pattern 125 is formed under the main storage line 155a, the first sub storage line 155b and the second sub storage line 155c to overlap the main storage line 155a, the first sub storage line 155b and the second sub storage line 155c, respectively. For example, the light-blocking pattern 125 may include a main light-blocking pattern 125a overlapping the main storage line 155a, a first sub light-blocking pattern 125b overlapping the first sub storage line 155b and a second sub light-blocking pattern 125c overlapping the second sub storage line 155c. The main light-blocking pattern 125a may extend in the second direction to overlap the main storage line 155a. The first sub light-blocking pattern 125b and the second sub light-blocking pattern 125c may each extend from the main light-blocking pattern 125a in the first direction to overlap the first sub storage line 155b and the second sub storage line 155c, respectively.

In an exemplary embodiment, the main storage line 155a and the main light-blocking pattern 125a may extend across the center of the pixel electrode 170. The second sub storage line 155c extends longer than the first sub storage line 155b in the first direction. Alternatively, the storage line 155 and the light-blocking pattern 125 may be substantially symmetrical with respect to a virtual line passing through the center of the pixel electrode 170 in the second direction.

In an exemplary embodiment, a first end portion 140a of the semiconductor layer 140 may overlap the pixel electrode 170, and a second end portion 140b opposite to the first end portion 140a may protrude from an edge of the pixel electrode 170 in a plan view. That is, the second end portion 140b of the semiconductor layer 140 may not overlap the pixel electrode 170. When a portion of the semiconductor layer 140 (i.e., the second end portion 140b) does not overlap the pixel electrode 170, the second end portion 140b of the semiconductor layer 140 may have relatively less affect on the capacitance of the storage capacitor. Therefore, the light-blocking pattern 125 may not overlap the second end portion 140b of the semiconductor layer 140. That is, the second end portion 140b of the semiconductor layer 140 may protrude from an edge of the light-blocking pattern 125 in a plan view.

Further, in some cases, it may be difficult to have the light-blocking pattern 125 overlapping the second end portion 140b of the semiconductor layer 140. For example, when the second end portion 140b of the semiconductor layer 140 is formed adjacent to the gate line GLn, the second sub light-blocking pattern 125c may be electrically shorted with the gate line GLn if the second sub light-blocking pattern 125c extends further toward the gate line GLn so as to overlap the second end portion 140b of the semiconductor layer 140. In the above-mentioned case, the second sub light-blocking pattern 125c may not overlap the second end portion 140b of the semiconductor layer 140 which has relatively little effect on the capacitance of the storage capacitor, so that the second sub light-blocking pattern 125c is sufficiently spaced apart from the gate line GLn. That is, while the first end portion 140a of the semiconductor layer 140 overlaps the second sub light-blocking pattern 125c, the second end portion 140b of the semiconductor layer 140 protrudes from an edge of the second sub light-blocking pattern 125c in a plan view and does not overlap the second sub light-blocking pattern 125c.

According to exemplary embodiments of the present invention, a light-blocking pattern is formed under a semiconductor layer to overlap the semiconductor layer, so as to block the light proceeding toward the semiconductor layer formed under a storage line. That is, the semiconductor layer is prevented from being excited by the light energy, so that characteristics of the storage line are not affected by the excited semiconductor layer. Accordingly, the change of the storage capacitance and the deviation of the kickback voltage may be prevented, and thus the quality of displayed images may be improved.

FIGS. 4A to 4G are cross-sectional views illustrating a method of manufacturing an array substrate in accordance with an example embodiment of the present invention.

Referring to FIGS. 2 and 4A, a first conductive layer (not illustrated) is formed on a base substrate 110. Then the first conductive layer is etched, for example, by a photolithography process using a first mask MASK1 to form a first conductive pattern 120 including gate lines GLn−1, GLn and GLn+1 and a light-blocking pattern 125.

In an exemplary embodiment, the first mask MASK1 includes a first opening portion 411 and a first shading portion 413. The first opening portion 411 transmits light proceeding toward a portion corresponding to the first conductive pattern 120. The first shading portion 413 blocks light proceeding toward a portion where the first conductive pattern 120 is not formed. Accordingly, the first conductive pattern 120 may be formed at portions exposed to the light.

Examples of metals that can be used for the first conductive pattern 120 include chromium, aluminum, tantalum, molybdenum, titanium, tungsten, copper and silver, for example, but are not limited thereto. These may be used alone, an alloy thereof or in a combination thereof. The first conductive pattern 120 may have a multilayer structure including a plurality of layers whose physical characteristics are different from each other.

In an exemplary embodiment, the light-blocking pattern 125 may include a main light-blocking pattern 125a, a first sub light-blocking pattern 125b and a second sub light-blocking pattern 125c. The main light-blocking pattern 125a may extend in the second direction, as illustrated in FIG. 2. The first sub light-blocking pattern 125b and the second sub light-blocking pattern 125c may each extend from the main light-blocking pattern 125a in the first direction, as illustrated in FIG. 2.

In an exemplary embodiment, the second sub light-blocking pattern 125c may extend in the first direction and may be longer than the first sub light-blocking pattern 125b. The light-blocking pattern 125 may be substantially symmetrical with respect to the main light-blocking pattern 125a.

Figure 4B:
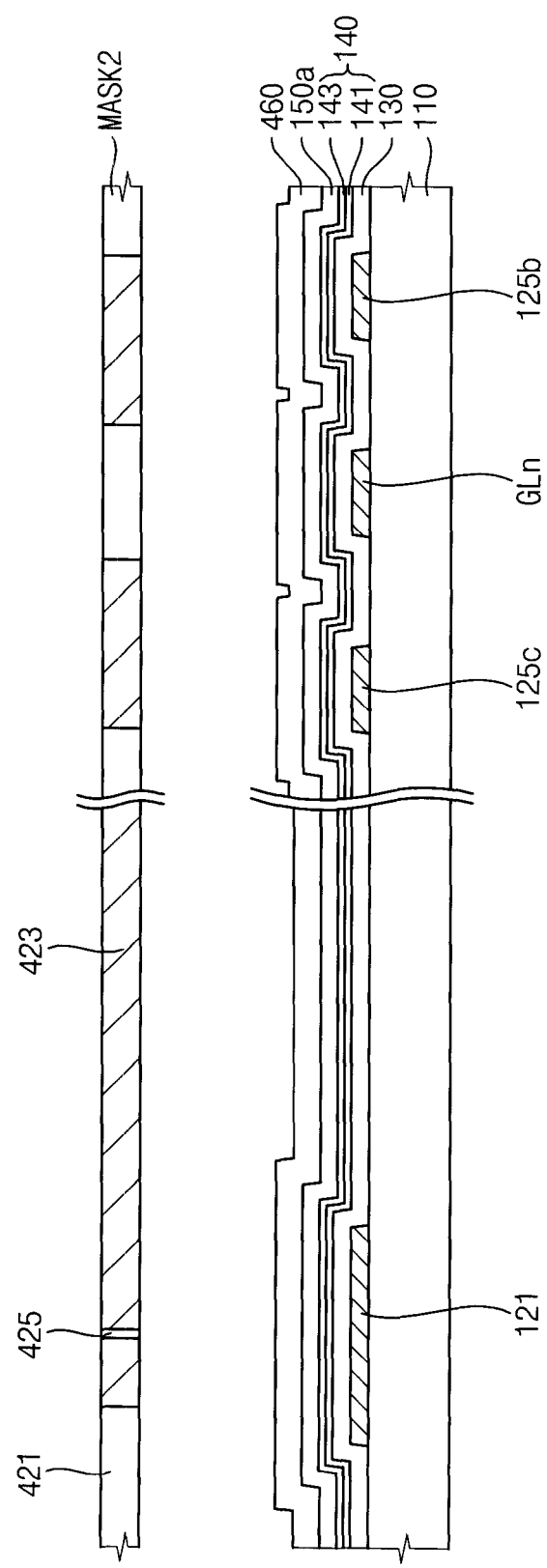

Referring to FIGS. 2 and 4B, a gate insulation layer 130 is formed on the base substrate 110 having the first conductive pattern 120. The gate insulation layer 130 may be formed, for example, by a plasma enhanced chemical vapor deposition ("PECVD") process.

A semiconductor layer 140 including an active layer 141 and an ohmic contact layer 143 is formed on the gate insulation layer 130. For example, the active layer 141 may include amorphous silicon. The ohmic contact layer 143 may be formed by implanting a high concentration of n+ ions on an upper portion of the amorphous silicon.

A second conductive layer 150a is formed on the semiconductor layer 140. Examples of metals which can be used for the second conductive layer 150a include chromium, aluminum, tantalum, molybdenum, titanium, tungsten, copper and silver, for example, but are not limited thereto. These may be used alone, an alloy thereof or in a combination thereof. The second conductive layer 150a may have a multilayer structure including a plurality of layers whose physical characteristics are different from each other.

A substantially entire surface of the second conductive layer 150a is coated with a photoresist layer 460. The photoresist layer 460 is then exposed through a second mask MASK2. In an exemplary embodiment as described in FIG. 4B, the photoresist layer 460 includes a positive photoresist, and the exposed portion of the photoresist layer 460 is removed by a developing agent.

The second mask MASK2 includes a slit 425, a second opening portion 421 and a second shading portion 423. Light incident into the slit 425 of the second mask MASK2 is dispersed by the slit 425. Therefore, the intensity of the light irradiated onto the photoresist layer 460 through the slit 425 is smaller than that of the light irradiated through the second opening portion 421. Accordingly, the photoresist layer 460 situated corresponding to the slit 425 is exposed to the light relatively less than that situated corresponding to the second opening portion 421. In FIG. 4b, a slit mask adjusting the intensity of the light through a slit is used as the second mask MASK2. Alternatively, a half-tone mask including a translucent portion instead of the slit may be used as the second mask MASK2.

The exposed photoresist layer 460 is developed, so that an exposed portion of the photoresist layer 460 is removed and an unexposed portion of the photoresist layer 460 remains to form a photoresist pattern.

Figure 4C:
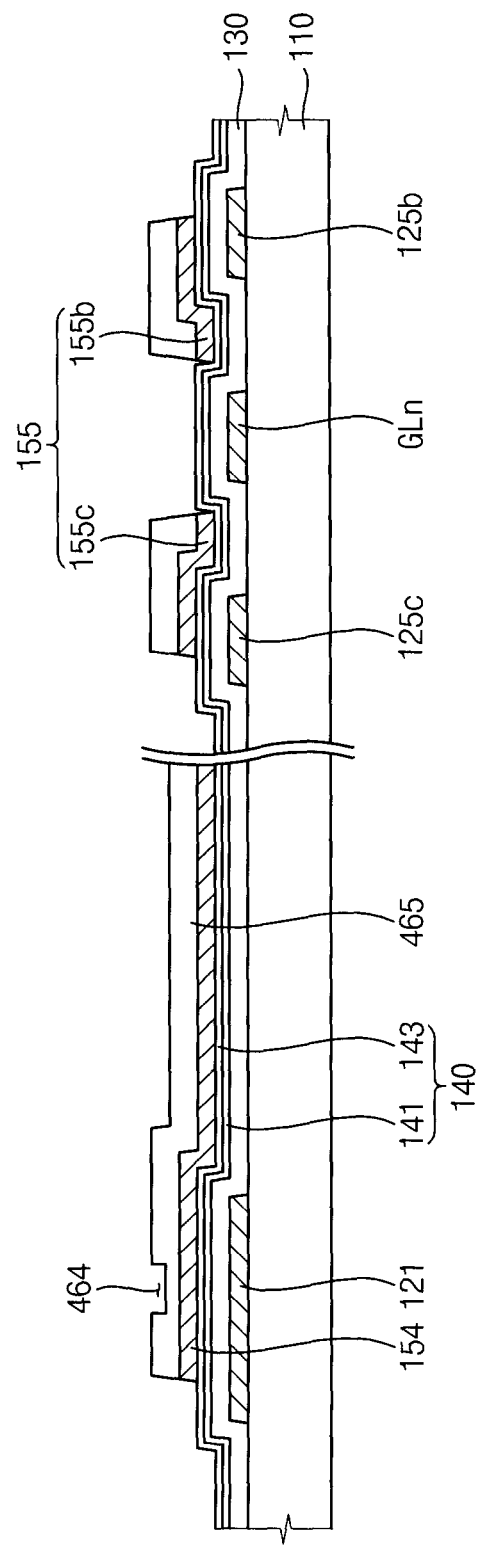

Referring to FIGS. 2, 4B and 4C, the photoresist layer 460 in FIG. 4B is patterned by the exposing process and the developing process, so that a portion of the photoresist layer 460 remains to form a photoresist pattern 465.

As described in FIG. 4B, the portion of the photoresist layer 460 situated corresponding to the slit 425 is relatively less exposed to the light, and thus the photoresist pattern 465 remaining at the region exposed to the light through the slit 425 is thinner than the photoresist pattern 465 remaining at the region that is not exposed to the light. Accordingly, a recessed portion 464 is formed at the portion of the photoresist pattern 465 exposed to the light through the slit 425.

The position of the recessed portion 464 may correspond to a region between a source electrode (not illustrated) and a drain electrode (not illustrated) which will be formed.

By using the photoresist pattern 465 as an etching mask, the second conductive layer 150a of FIG. 4B is etched to form a second conductive pattern 150 including data lines DLm and DLm+1 and a storage line 155. The data lines DLm and DLm+1 overlap the gate lines GLn−1, GLn and GLn+1. The storage line 150 overlaps the light-blocking pattern 125. The second conductive pattern 150 further includes a pre-source/drain electrode pattern 154 for forming a source electrode (not illustrated) and a drain electrode (not illustrated).

In an exemplary embodiment, the second conductive pattern 150 may be patterned to further include the first connection electrode 156 and the second connection electrode 157 described in FIG. 2. The first and second connection electrodes 156 and 157 may extend from the pre-source/drain electrode pattern 154.

In an exemplary embodiment, the storage line 155 may include a main storage line 155a overlapping the main light-blocking pattern 125a, a first sub storage line 155b overlapping the first sub light-blocking pattern 125b and a second sub storage line 155c overlapping the second sub light-blocking pattern 125c. The main storage line 155a may extend in the second direction. The first sub storage line 155b and the second sub storage line 155c may extend from the main storage line 155a in the first direction.

Figure 4D:
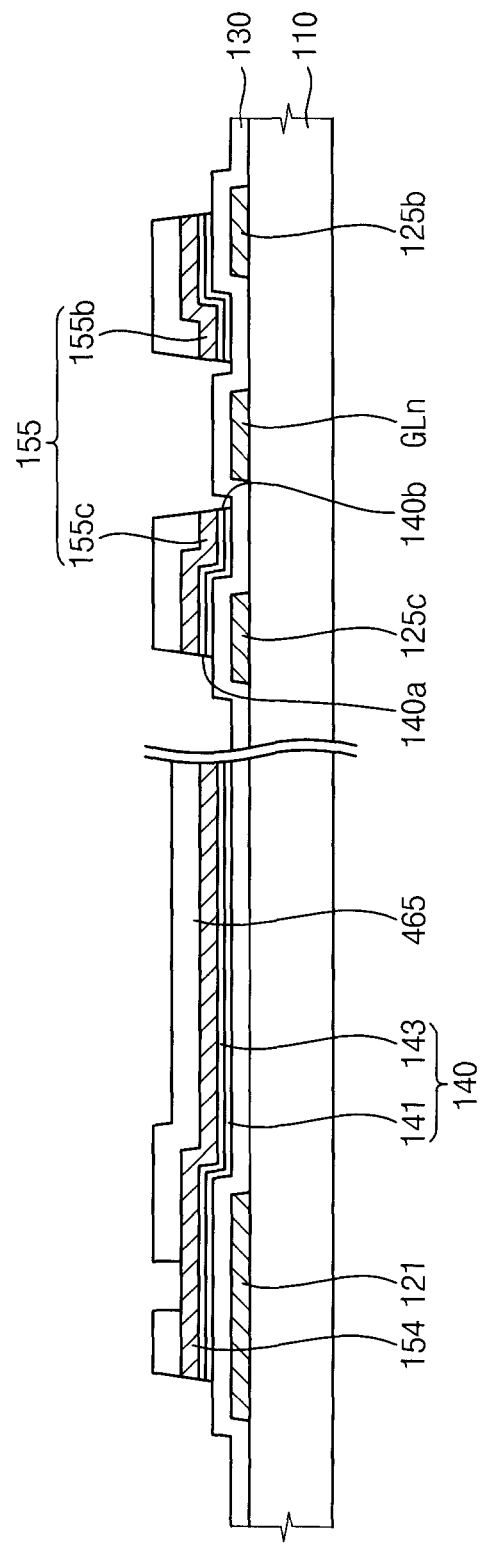

Referring to FIGS. 2 and 4D, the semiconductor layer 140 is etched using the photoresist pattern 465 and the second conductive pattern 150 as an etching mask to form a pattern of the semiconductor layer 140 under the second conductive pattern 150. Although the second conductive pattern 150 and the semiconductor layer 140 are separately etched in the exemplary embodiment described in FIGS. 4C and 4D, alternatively, the second conductive pattern 150 and the semiconductor layer 140 may be simultaneously etched.

The pattern of the semiconductor layer 140 is substantially the same as the second conductive pattern 150. To reduce the number of processes or masks as described above, the second conductive pattern 150 and the semiconductor layer 140 may be patterned using the same mask (i.e., the second mask MASK2 in FIG. 4B). Therefore, in the above-described process, the pattern of the semiconductor layer 140 corresponding to the storage line 155 may be inevitably formed under the storage line 155. Accordingly, the semiconductor layer 140 overlaps the light-blocking pattern 125, and likewise, the storage line 155 overlaps the light-blocking pattern 125.

In an exemplary embodiment, the semiconductor layer 140 may be patterned so that a first end portion 140a of the semiconductor layer 140 overlaps the light-blocking pattern 125, and a second end portion 140b opposite to the first end portion 140a protrudes from an edge of the light-blocking pattern 125 in a plan view. That is, the semiconductor layer 140 may be patterned so that the second end portion 140b of the semiconductor layer 140 does not overlap the light-blocking pattern 125. For example, the second sub light-blocking pattern 125c may overlap the first end portion 140a of the semiconductor layer 140, and may not overlap the second end portion 140b of the semiconductor layer 140.

An ashing process is performed to thin down the photoresist pattern 465. In the ashing process, for example, an oxygen ($O_2$) plasma discharge is used. As a result of the ashing process, the thickness of the photoresist pattern 465 is reduced, and a portion of the photoresist pattern 465 corresponding to the portion where the recessed portion 464 was formed is removed to expose a portion of the pre-source/drain electrode pattern 154.

Referring to FIGS. 2 and 4E, the portion of the pre-source/drain electrode pattern 154 of FIG. 4D exposed through the photoresist pattern 465 by the ashing process is etched to form a source electrode 151 and a drain electrode 153 spaced apart from the source electrode 151. Accordingly, an ohmic contact layer 143 is exposed through the portion between the source electrode 151 and the drain electrode 153.

The exposed ohmic contact layer 143 is etched using the source electrode 151 and the drain electrode 153 as an etching mask. Accordingly, a channel portion 159 exposing an active layer 141 is formed between the source electrode 151 and the drain electrode 153.

Figure 4F:
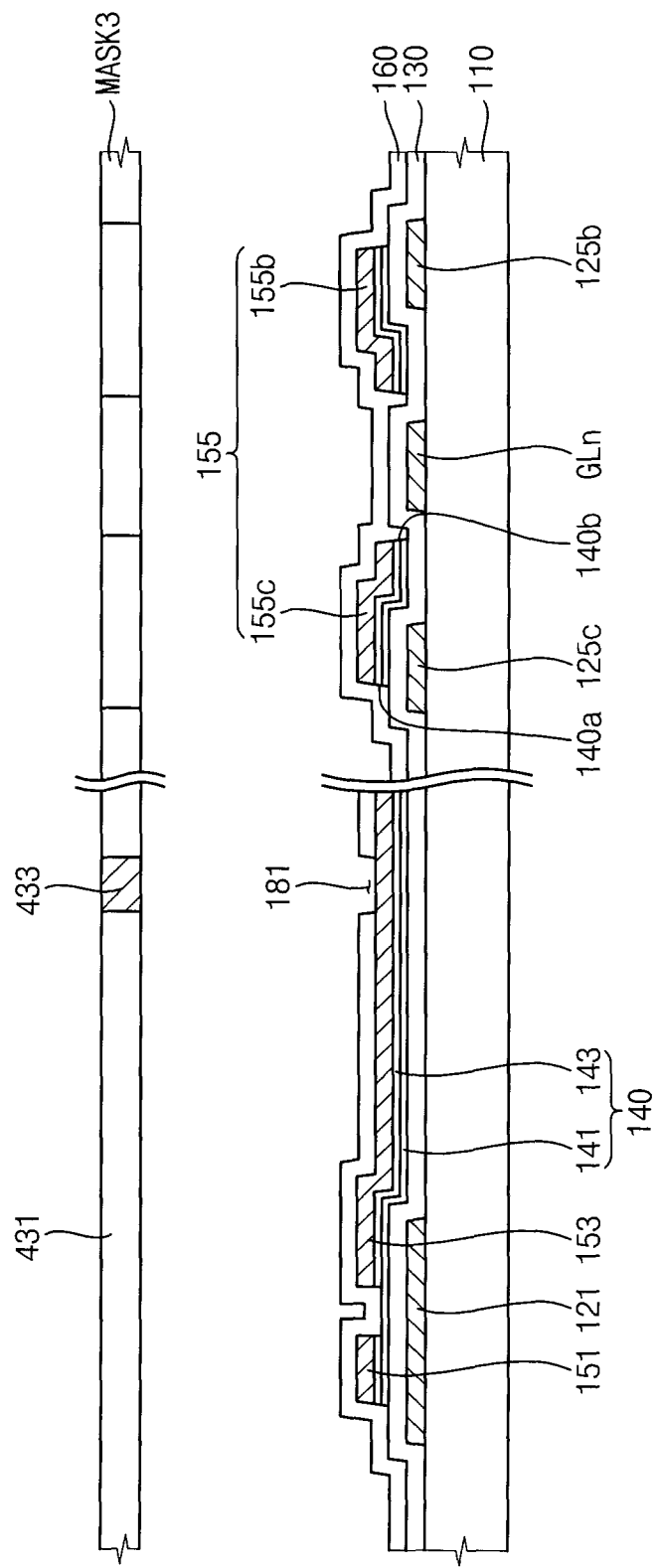

Referring to FIGS. 2 and 4F, a passivation layer 160 is formed on the gate insulation layer 130 and the second conductive pattern 150. The passivation layer 160 is partially removed by a photolithography process using a third mask MASK3 as an etching mask to form a contact hole 181 through which a portion of the drain electrode 153 is exposed.

In an exemplary embodiment of the photolithography process, the third mask MASK3 includes a third opening portion 431 transmitting light and a third shading portion 433 corresponding to a portion where the contact hole 181 is formed. The third shading portion 433 blocks light proceeding toward the portion where the contact hole 181 will be formed, and thus a portion of a photoresist layer (not illustrated) corresponding to the portion where the contact hole 181 will be formed is not exposed to the light. When the non-exposed portion of the photoresist layer is developed, the non-exposed portion of the photoresist layer is removed to form the contact hole 181.

Figure 4G:
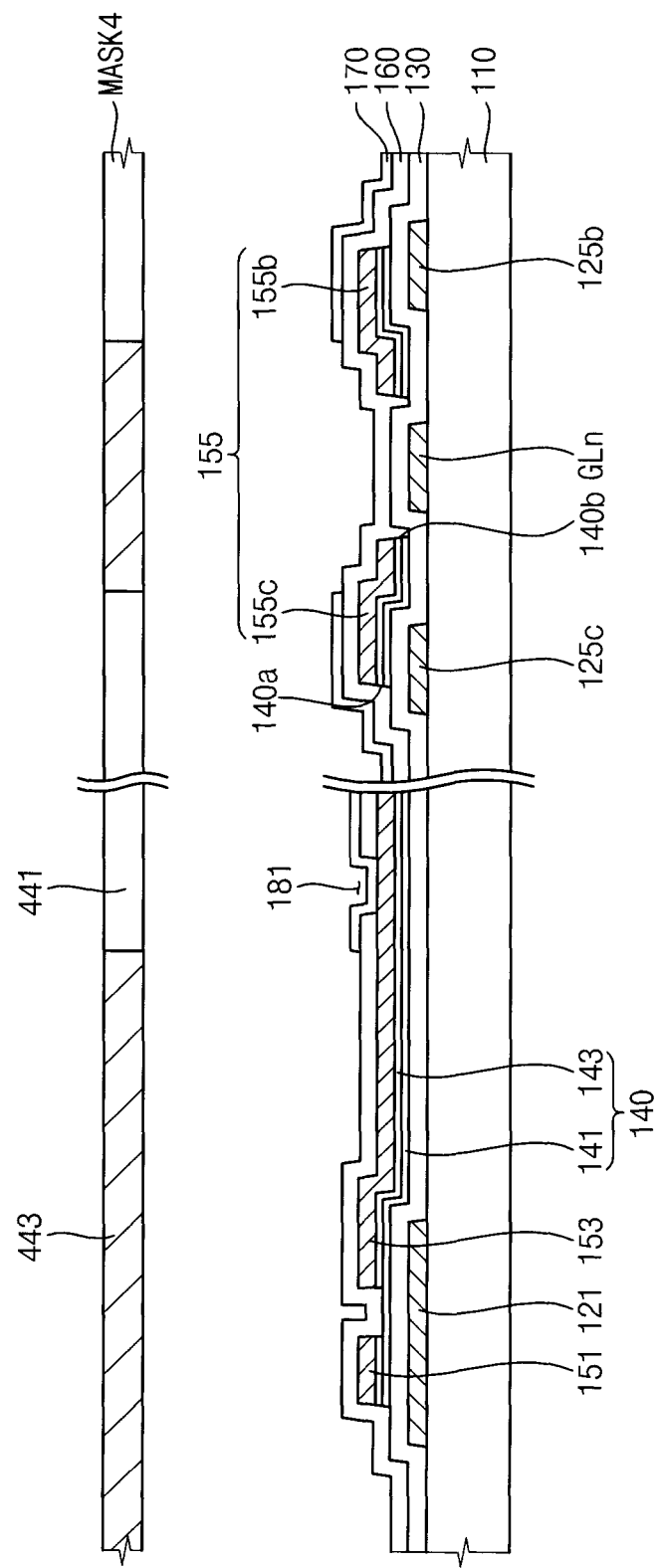

Referring to FIGS. 2 and 4G, a transparent conductive layer (not illustrated) is deposited on the passivation layer 160 having the contact hole 181. Examples of a transparent conductive material that can be used for the transparent conductive layer include indium tin oxide ("ITO") and indium zinc oxide ("IZO"), for example, but are not limited thereto. The transparent conductive layer is also deposited in the contact hole 181.

The transparent conductive layer is etched using a fourth mask MASK4 as an etching mask. In an exemplary embodiment, the transparent conductive layer remains at the region corresponding to a fourth opening portion 441 of the fourth mask MASK4, the transparent conductive layer corresponding to a fourth shading portion 443 of the fourth mask MASK4 is removed to form a pixel electrode 170. Accordingly, the pixel electrode 170 is electrically connected to the drain electrode 153 through the pixel electrode 170.

According to exemplary embodiments of the present invention, as described above referring to FIGS. 4A to 4G, the array substrate 100 may be formed by using four masks, so that the number of processes may be reduced.

When the array substrate 100 is formed using four masks, as described above, the semiconductor layer 140 is usually formed under the storage line 155. Here, when light provided from underneath the array substrate 100 to display an image enters into the semiconductor layer 140, the semiconductor layer 140 is excited by light energy, and thus the electrical characteristics of the storage line 155 formed on the semiconductor layer 140 may be affected by the excited semiconductor layer 140.

According to the exemplary embodiments of the present invention, to block the light proceeding toward the semiconductor layer 140, the light-blocking pattern 125 is formed under the semiconductor layer 140, particularly, where the semiconductor layer 140 overlaps the pixel electrode 170. Accordingly, the light proceeding toward the region where the semiconductor layer 140 overlaps the pixel electrode 170 (for example, the first end portion 140a of the semiconductor layer 140) is blocked by the light-blocking pattern 125, so that the semiconductor layer 140 may be prevented from being excited by the light energy. Therefore, the change of the storage capacitance and the deviation of the kickback voltage may be prevented, thereby improving the quality of displayed images.

Figure 5:
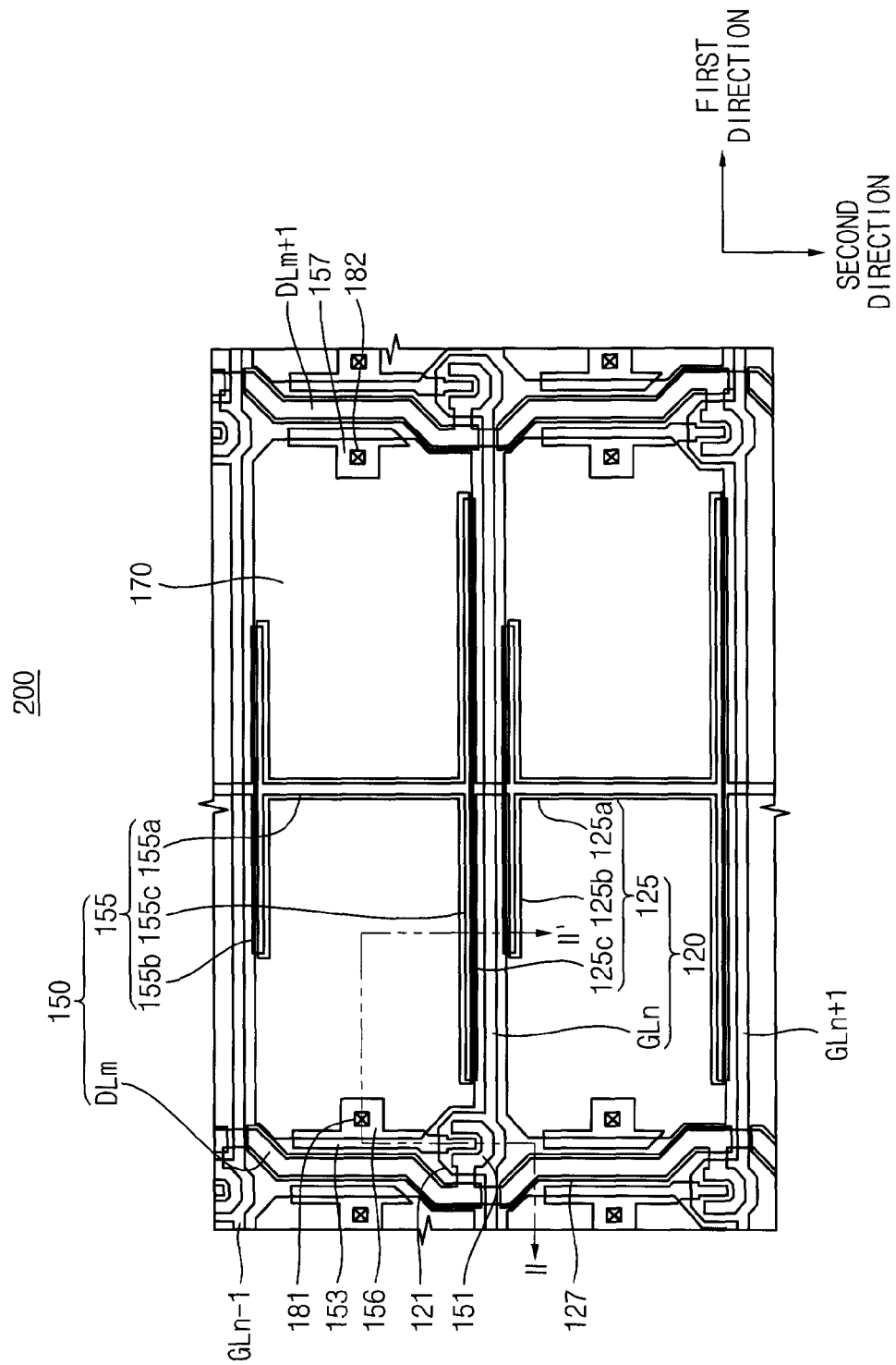
FIG. 5 is a plan view illustrating a portion of the array substrate in accordance with another exemplary embodiment of the present invention.
Figure 6:
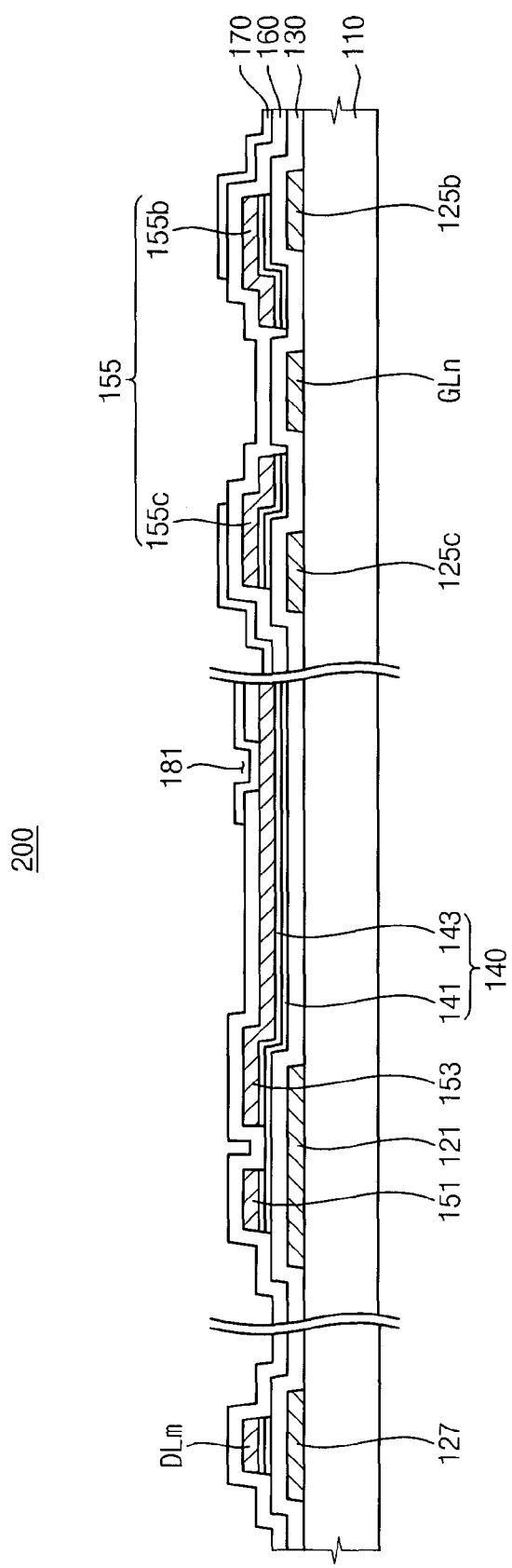
FIG. 6 is a cross-sectional view of the array substrate taken along line II-II' in FIG. 5.

FIG. 5 is a plan view illustrating a portion of the array substrate 200 in accordance with another exemplary embodiment of the present invention. FIG. 6 is a cross-sectional view of the array substrate taken along line II-II' in FIG. 5.

The array substrate 200 described with reference to FIGS. 5 and 6 may have substantially the same structure as the array substrate 100 described with reference to FIGS. 1 to 3 except that the array substrate 200 further includes a second light-blocking pattern formed under a data line to overlap the data line. Therefore, the same reference numbers are used for the same or similar elements, and any further descriptions concerning the same or similar elements as those described in FIGS. 1 to 3 will be omitted.

Referring to FIGS. 5 and 6, the array substrate 200 includes a base substrate 110 including a plurality of pixel regions, a first conductive pattern 120 formed on the base substrate 110, a semiconductor layer 140 formed on the first conductive pattern 120, a second conductive pattern 150 formed on the semiconductor layer 140, and a pixel electrode 170 formed on the second conductive pattern 150.

The first conductive pattern 120 includes gate lines GLn−1, GLn and GLn+1, a first light-blocking pattern 125 and a second light-blocking pattern 127. Herein, 'n' represents a natural number larger than one.

The first conductive pattern 120 further includes a gate electrode 121 protruding from the gate lines GLn−1, GLn and GLn+1. Repeated descriptions of the gate electrode 121 and the gate lines GLn−1, GLn and GLn+1 will be omitted.

A gate insulation layer 130 is formed on the first conductive pattern 120 to cover the first conductive pattern 120. A semiconductor layer 140 including an active layer 141 and an ohmic contact layer 143 is formed on the gate insulation layer 130. Repeated descriptions of the gate insulation layer 130 and the semiconductor layer 140 will be omitted.

The second conductive pattern 150 includes data lines DLm and DLm+1 and a storage line 155 overlapping the first light-blocking pattern 125. Herein, 'm' represents a natural number. The data lines DLm and DLm+1 are formed on the base substrate 110, and extend in the second direction, as illustrated in FIG. 5. The storage line 155 is formed on the semiconductor layer 140. The storage line 155 may include a main storage line 155a, a first sub storage line 155b and a second sub storage line 155c.

The second conductive pattern 150 further includes a source electrode 151 extending from the data lines DLm and DLm+1, and a drain electrode 153 spaced apart from the source electrode 151. Repeated descriptions of the second conductive pattern 150 will be omitted.

A passivation layer 160 may be formed on the second conductive pattern 150 to cover the source electrode 151, the drain electrode 153 and the storage line 155.

As described above, in the process for reducing the number of masks, the semiconductor layer 140 may be formed under the second conductive pattern 150.

In an exemplary embodiment described with reference to FIGS. 5 and 6, a second light-blocking pattern 127 is formed under the data lines DLm and DLm+1. The second light-blocking pattern 127 blocks the light proceeding toward the semiconductor layer 140 formed under the data lines DLm and DLm+1. Further, the first light-blocking pattern 125 may overlap the semiconductor layer 140 formed under the storage line 155.

When the first and second light-blocking patterns 125 and 127 overlap the semiconductor layer 140, the first and second light-blocking patterns 125 and 127 may block the light proceeding toward the semiconductor layer 140. Here, it is noted that the first and second light-blocking patterns 125 and 127 are included with the first conductive pattern 120 which is a conductive pattern including the gate lines GLn−1, GLn and GLn+1.

When light provided from underneath the array substrate 200 to display an image enters into the semiconductor layer 140, the semiconductor layer 140 is excited by light energy, and thus the electrical characteristics of the storage line 155 or the data lines DLm and DLm+1 formed on the semiconductor layer 140 may be affected by the excited semiconductor layer 140.

For example, the capacitance of the storage capacitor formed by the storage line 155 may be affected by the excited semiconductor layer 140, or a data voltage applied to the data lines DLm and DLm+1 may be unstable. The change of the electrical characteristics causes an unbalance of brightness, or causes image flicker or a waterfall defect displaying stripes. Therefore, the first and second light-blocking patterns 125 and 127 are formed under the semiconductor layer 140 to prevent the semiconductor layer 140 from being excited by the light energy.

Furthermore, even though a light-blocking layer (not illustrated), which is formed on an opposite substrate (not illustrated) facing the array substrate 200 and formed corresponding to the data lines DLm and DLm+1, may be misaligned with the data lines DLm and DLm+1, the second light-blocking pattern 127 may compensate the misalignment because the second light-blocking pattern 127 may block the light. Therefore, the width of the light-blocking layer (so-called black matrix) may be reduced owing to the second light-blocking pattern 127.

As mentioned above, the first and second light-blocking patterns 125 and 127 are formed with the same conductive layer as that which forms the gate lines GLn−1, GLn and GLn+1 and the gate electrode 121.

In an exemplary embodiment, the first light-blocking pattern 125 may include a main first light-blocking pattern 125*a* overlapping the main storage line 155*a*, a first sub first light-blocking pattern 125*b* overlapping the first sub storage line 155*b* and a second sub first light-blocking pattern 125*c* overlapping the second sub storage line 155*c*.

A pixel electrode 170 is formed in each unit pixel in which a pixel voltage may be applied thereto. The pixel electrode 170 may be formed on the passivation layer 160. The pixel electrode 170 is electrically connected to a TFT through contact holes 181 and 182 which are formed at the passivation layer 160. In an exemplary embodiment, the pixel electrode 170 is electrically connected to a first connection electrode 156 extending from the drain electrode 153 through a first contact hole 181. Further, the pixel electrode 170 may be electrically connected to a second connection electrode 157 extending from the drain electrode 153 through a second contact hole 182. Repeated descriptions of the pixel electrode 170, the first contact hole 181, the second contact hole 182, the first connection electrode 156 and the second connection electrode 157 will be omitted.

According to the above-described exemplary embodiment in accordance with the present invention, a second light-blocking pattern is formed under a semiconductor layer to overlap the semiconductor layer, so as to block the light proceeding toward the semiconductor layer formed under a data line. That is, the semiconductor layer is prevented from being excited by the light energy, so that electrical characteristics of the data line are not affected by the excited semiconductor layer, and thus the quality of displayed images may be improved. Further, the width of a light-blocking layer (so-called black matrix) formed on an opposite substrate (not shown) may be reduced.

A method for forming the array substrate described with reference to FIGS. 5 and 6 may be substantially the same as the method for forming the array substrate 100 described with reference to FIGS. 4A to 4G except that the array substrate 200 further includes the second light-blocking pattern 127 formed under the data line to overlap the data line. Therefore, the same reference numbers are used for the same or similar elements, and any further descriptions concerning the same or similar elements as those described in FIGS. 4A to 4G will be omitted.

FIG. 7 is a cross-sectional view illustrating a portion of the array substrate in accordance with yet another exemplary embodiment of the present invention.

The array substrate 300 described with reference to FIG. 7 may have substantially the same structure as the array substrate 200 described with reference to FIGS. 5 and 6 except that the array substrate 300 further includes a third light-blocking pattern formed under a drain electrode of a TFT and a connection electrode corresponding to a contact hole. Therefore, the same reference numbers are used for the same or similar elements, and any further descriptions concerning the same or similar elements as those described in FIGS. 5 and 6 will be omitted.

Referring to FIGS. 5 and 7, the array substrate 300 includes a base substrate 110 including a plurality of pixel regions, a first conductive pattern 120 formed on the base substrate 110, a semiconductor layer 140 formed on the first conductive pattern 120, a second conductive pattern 150 formed on the semiconductor layer 140, and a pixel electrode 170 formed on the second conductive pattern 150.

The first conductive pattern 120 includes gate lines GLn−1, GLn and GLn+1, a first light-blocking pattern 125, a second light-blocking pattern 127 and a third light-blocking pattern 129. The second conductive pattern 150 includes a data line DLm, a source electrode 151, a drain electrode 153, a storage electrode 125 and a connection electrode 156. The connection electrode 156 is substantially the same as the first connection electrode 156 or the second connection electrode 157 described in FIGS. 5 and 6.

A gate insulation layer 130 is formed on the first conductive pattern 120 to cover the first conductive pattern 120. A semiconductor layer 140 includes an active layer 141 and an ohmic contact layer 143. Repeated descriptions of the gate insulation layer 130 and the semiconductor layer 140 will be omitted. A passivation layer 160 may be formed on the second conductive pattern 150 to cover the source electrode 151, the drain electrode 153 and the storage line 155.

As described above, in the process for reducing the number of masks, the semiconductor layer 140 may be formed under the second conductive pattern 150.

In an exemplary embodiment described with reference to FIG. 7, a third light-blocking pattern 129 is further formed under the drain electrode 153 and the connection electrode 156. The third light-blocking pattern 129 overlaps the semiconductor layer 140 which is formed under the drain electrode 153 and the connection electrode 156. Accordingly, when light is provided from underneath the array substrate 300, the third light-blocking pattern 129 may block the light proceeding toward the semiconductor layer 140. It is noted that the third light-blocking pattern 129 is included to the first conductive pattern 120 which is a conductive pattern including the gate line GLn and the gate electrode 121.

When the light enters into the semiconductor layer 140, the semiconductor layer 140 is excited by light energy, and thus the electrical characteristics of the drain electrode 153 and the connection electrode 156 formed on the semiconductor layer 140 may be affected by the excited semiconductor layer 140. To prevent the semiconductor layer 140 from being excited, the third light-blocking pattern 129 blocks the light proceeding toward the semiconductor layer 140 which is formed under the drain electrode 153 and the connection electrode 156.

The first light-blocking pattern 125 and the second light-blocking pattern 127 are already described with reference to FIGS. 5 and 6, and thus repeated descriptions will be omitted.

A method for forming the array substrate 300 described in FIG. 7 may be substantially the same as the method for forming the array substrate 100 described with reference to FIGS. 4A to 4G except that the array substrate 300 further includes the third light-blocking pattern 129 formed under the connection electrode 156 and the drain electrode 153. Therefore, repeated descriptions will be omitted.

The foregoing is illustrative of the disclosure of exemplary embodiments of the present invention and is not to be construed as limiting thereof. Although a few exemplary embodiments have been described, those skilled in the art will readily appreciate from the above that many modifications are possible in the exemplary embodiments without materially departing from the novel teachings and advantages of the present disclosure. Accordingly, all such modifications are intended to be included within the spirit and scope of this disclosure. Therefore, it is to be understood that the foregoing is not to be construed as limiting itself to the specific embodiments disclosed, and that modifications to the disclosed embodiments, as well as other embodiments, are intended to be included as defined by the appended claims.

What is claimed is:

1. A method for manufacturing an array substrate, the method comprising:
   forming a first conductive layer on a base substrate and patterning the first conductive layer to form a first conductive pattern including a gate line and a first light-blocking pattern;
   forming a semiconductor layer and a second conductive layer on the first conductive pattern;
   patterning the second conductive layer and the semiconductor layer to form a second conductive pattern and a pattern of the semiconductor layer overlapping the first light-blocking pattern, the second conductive pattern including a data line and a storage line;
   forming a pixel electrode on the second conductive layer, the pixel electrode overlapping the storage line; and
   totally insulating the storage line from the pixel electrode with an insulative layer,
   wherein the data line is extended in a second direction crossing a first direction defining an extension direction of the gate line and the storage line overlaps the first light-blocking pattern.

2. The method of claim 1, wherein the semiconductor layer is in contact with the storage line.

3. The method of claim 2, wherein the semiconductor layer is patterned so that a first end portion of the semiconductor layer overlaps the first light-blocking pattern and a second end portion of the semiconductor layer opposite to the first end portion protrudes from an edge of the first light-blocking pattern in a plan view.

4. The method of claim 1, wherein the storage line includes:
   a main storage line extending in the second direction;
   a first sub storage line extending from the main storage line in the first direction substantially perpendicular to the second direction, the first sub storage line overlapping a first end portion of the pixel electrode; and
   a second sub storage line extending from the main storage line in the first direction substantially perpendicular to the second direction, the second sub storage line overlapping a second end portion of the pixel electrode opposite to the first end portion thereof.

5. The method of claim 4, wherein the first light-blocking pattern includes:
   a main light-blocking pattern extending in the second direction and overlapping the main storage line;
   a first sub light-blocking pattern extending from the main light-blocking pattern in the first direction and overlapping the first sub storage line; and
   a second sub light-blocking pattern extending from the main light-blocking pattern in the first direction and overlapping the second sub storage line.

6. The method of claim 1, wherein the first conductive pattern further includes a second light-blocking pattern overlapping the data line.

7. The method of claim 1, wherein the patterning the second conductive layer to form the second conductive pattern includes patterning the second conductive layer to form a source electrode and a drain electrode spaced apart from the source electrode.

8. The method of claim 7, wherein the patterning the second conductive layer to form the source electrode and the drain electrode includes:
   forming a photoresist layer on the second conductive layer;
   patterning the photoresist layer using a slit mask having a slit or a half-tone mask having a translucent portion to form a photoresist pattern having a recessed portion situated corresponding to the slit or the translucent portion;
   removing a portion of the photoresist pattern, corresponding to where the recessed portion is situated, to expose a portion of the second conductive layer corresponding to where the recessed portion is situated; and
   etching the exposed portion of the second conductive layer to form the source electrode and the drain electrode.

* * * * *